United States Patent
Song

(10) Patent No.: US 7,521,328 B2
(45) Date of Patent: Apr. 21, 2009

(54) METHODS OF FABRICATING BIPOLAR TRANSISTOR WITH EMITTER AND COLLECTOR IN SEPARATE DEVICE ISOLATION TRENCHES

(75) Inventor: Yoo Seon Song, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 286 days.

(21) Appl. No.: 11/027,145

(22) Filed: Dec. 28, 2004

(65) Prior Publication Data

US 2005/0139957 A1 Jun. 30, 2005

(30) Foreign Application Priority Data

Dec. 31, 2003 (KR) .................... 10-2003-0101064

(51) Int. Cl.
*H01L 21/331* (2006.01)
*H01L 21/8222* (2006.01)

(52) U.S. Cl. ...................... 438/311; 438/309
(58) Field of Classification Search ............... 438/267; 257/500, 316
See application file for complete search history.

(56) References Cited

U.S. PATENT DOCUMENTS

| | | | | | |
|---|---|---|---|---|---|
| 3,920,482 | A | * | 11/1975 | Russell | 438/421 |
| 4,047,975 | A | * | 9/1977 | Widmann | 438/348 |
| 4,241,359 | A | * | 12/1980 | Izumi et al. | 257/386 |
| 4,682,405 | A | * | 7/1987 | Blanchard et al. | 438/274 |
| 4,786,614 | A | * | 11/1988 | Cogan | 438/421 |
| 4,860,084 | A | * | 8/1989 | Shibata | 257/288 |
| 5,014,107 | A | * | 5/1991 | Vora | 257/511 |
| 5,583,368 | A | * | 12/1996 | Kenney | 257/621 |
| 5,587,599 | A | | 12/1996 | Mahnkopf et al. | |
| 5,798,539 | A | | 8/1998 | Jorke | |
| 5,837,557 | A | * | 11/1998 | Fulford et al. | 438/6 |
| 5,861,104 | A | * | 1/1999 | Omid-Zohoor | 216/84 |
| 6,013,941 | A | | 1/2000 | Shimizu | |

(Continued)

FOREIGN PATENT DOCUMENTS

JP 11-340242 12/1999

OTHER PUBLICATIONS

Yasushi Kinoshita; Lateral Transistor and Its Manufacture; Publication No. 0340242A 0; Publication Date: Dec. 10, 1999; Patent Abstracts of Japan; Japanese Patent Office.

*Primary Examiner*—David Vu
*Assistant Examiner*—Andres Lopez Esquerra
(74) *Attorney, Agent, or Firm*—Andrew D. Fortney

(57) ABSTRACT

A bipolar transistor and method of fabricating the same is disclosed. Particularly, a bipolar transistor may have an emitter and a collector diffusion layer in the sidewalls and the bottom of a device isolation trench. A method includes the steps of: forming a device isolation trench in a substrate; forming a photoresist pattern and implanting ions into the sidewalls and the bottom of the trench to form an emitter and a collector; removing the photoresist pattern; and filling the trench with an insulation layer to form the device isolation structure. Accordingly, the transistor and method can minimize device area by forming the diffusion layer of an emitter and a collector in the sidewalls and the bottom of the trench, and can provide a deep impurity diffusion layer without a high temperature diffusion process. In addition, the transistor and method can provide both a high amplification factor and a high current driving force.

16 Claims, 3 Drawing Sheets

U.S. PATENT DOCUMENTS 6,177,333 B1 * 1/2001 Rhodes ....................... 438/433
6,265,735 B1 * 7/2001 Takahashi et al. ........... 257/136
2003/0104658 A1 * 6/2003 Furukawa et al. ........... 438/151

* cited by examiner

METHODS OF FABRICATING BIPOLAR TRANSISTOR WITH EMITTER AND COLLECTOR IN SEPARATE DEVICE ISOLATION TRENCHES

BACKGROUND OF THE INVENTION

1. Field of the Invention

The present invention relates to a bipolar transistor and a method of fabricating the same, and more particularly, to a bipolar transistor having an emitter and a collector diffusion layer in the sidewalls and the bottom of a device isolation trench and a method of fabricating the same.

2. Background of the Related Art

Due to a great interest in a composite semiconductor, whose memory and logic are formed within a single chip, its usage is increasing. Because the composite semiconductor device can integrate memory and logic into a single chip and manufacture the same in a single process, it can operate faster and use less electric power than existing combinations of chips without any substantial change of design.

On the other hand, as the manufacturing processes of memory products and logic products are simultaneously performed, the size of the single chip is getting larger and, therefore, there are a lot of difficulties in conducting the manufacturing process. In addition, the transistor in the memory focuses on prevention of leakage current rather than providing a high current driving force. On the other hand, logic product transistors sometimes require a high current driving force. Such mixed function products (i.e., containing both memory and logic) need to be manufactured with both characteristics.

An example of a conventional method of fabricating bipolar transistors in semiconductor devices is illustrated in the accompanying drawings, in which FIG. 1 is a top view of a bipolar transistor in a conventional composite semiconductor, and FIG. 2 is a cross-sectional view of the conventional bipolar transistor along the line A-A' in FIG. 1.

As illustrated in FIG. 1 and FIG. 2, after the formation of a device isolation region in a semiconductor substrate, an N-type well 10 is formed in a predetermined region of the semiconductor substrate and a P-type well 11 having a predetermined depth is formed in the N-type well 10. Here, the thickness of the P-type well 11 is generally between 1 and 1.2 µm. Therefore, it is difficult to realize the transistor that has a high amplification gain. On the other hand, a DRAM bit line that will be formed in a later process can not be formed in the P-type junction because it uses N-type doped silicon. Therefore, the first N+ region 14 is formed in the P-type well 11. After the source/drain junction of a DRAM transistor is formed, or P+ region 13 is formed in the P-type well 11, the second N+ region 12 is formed for collector pick-up in the N-type well 10.

Metal contacts are formed respectively for the first and second N+ regions 14 and 12 and the P+ region 13 in the later processes (not shown), which function as an emitter, a base and a collector, respectively. That is, the first N+ region 14 becomes the emitter, the P+ region 13 becomes the base, and the second N+ region 12 becomes the collector.

Although the existing method of fabricating the bipolar transistor as described above integrates both the memory and the logic as a semiconductor device into a single chip and in a single process, it is difficult to make a transistor that has a high amplification gain because of the depth of well, and to form both the emitter and the collector that have deep junction depth because of limitations on the source/drain diffusion layer that are formed in the memory transistors at the same time. Therefore, a direct current amplification factor ($h_{fe}$) and/or the implantation efficiency of holes is low.

SUMMARY OF THE INVENTION

Accordingly, the present invention is directed to a bipolar transistor and method of manufacturing the same that substantially obviates one or more problems due to limitations and disadvantages of the related art.

An object of the present invention is to provide a bipolar transistor and method of manufacturing the same which provides both a high amplification factor and a high current driving force.

Further objects of the present invention include minimizing a device area by forming the diffusion layer of an emitter and a collector in a device isolation trench (e.g., in the trench sidewalls and/or bottom), and providing a deep impurity diffusion layer (enabled by using the device isolation structure, without necessarily using a high temperature diffusion process).

To achieve these objects and other advantages, and in accordance with the purpose of the invention as embodied and broadly described herein, a method of fabricating a bipolar transistor comprises the steps of: forming a device isolation trench in a substrate; forming a photoresist pattern and implanting ions into the sidewalls and the bottom of the trench to form an emitter and a collector; removing the photoresist pattern; and filling the trench with an insulation layer to form a device isolation structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings, in which FIG. 3a through FIG. 3d are cross-sectional views illustrating example processes of fabricating the bipolar transistor according to an embodiment of the present invention.

Figure 1:
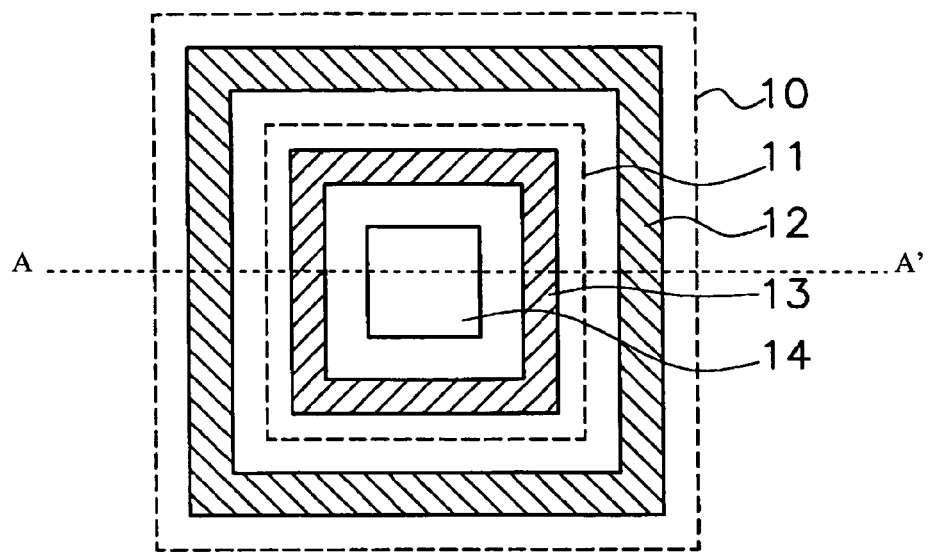
FIG. 1 is a top view illustrating a conventional bipolar transistor and method of fabricating the same.
Figure 2:
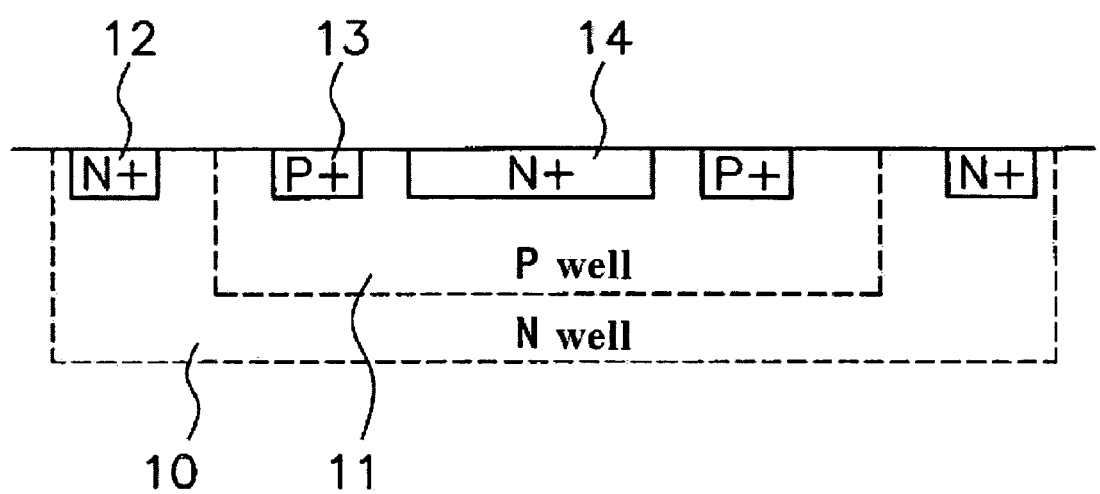
FIG. 2 is a cross-sectional view of the conventional bipolar transistor of FIG. 1.
Figure 3A:
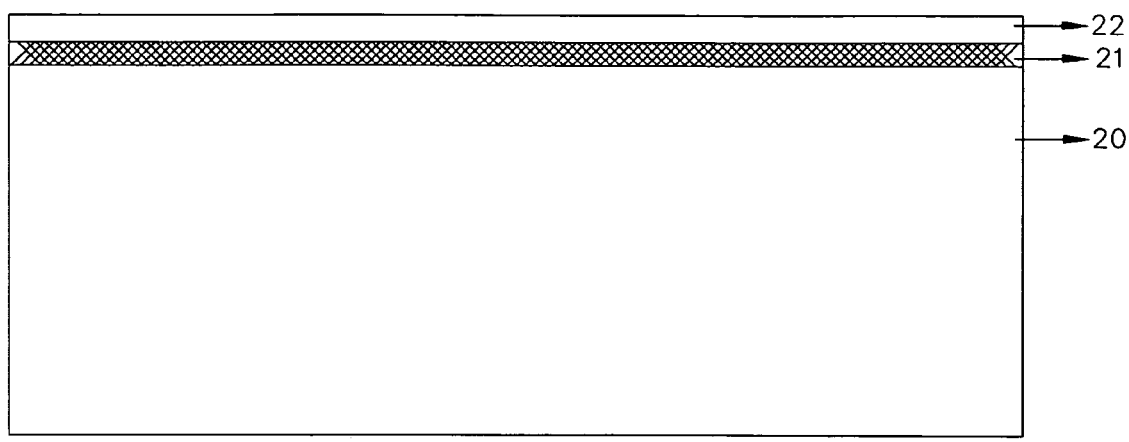
FIG. 3a through FIG. 3d are cross-sectional views illustrating example processes of fabricating a bipolar transistor according to an embodiment of the present invention.

Referring to FIG. 3a, a buffer layer 21 and a nitride layer 22 (not drawn to scale) are successively formed on the upper part of a semiconductor substrate 20. First, buffer layer 21 may comprise a silicon oxide layer grown to a thickness of from 50 Å to 150 Å. Then, a silicon nitride layer is deposited thereon, having a thickness of from 1000 Å to 1500 Å. This buffer layer works as a buffer to reduce the stress exerted by the nitride layer, and the nitride layer works as an polish or etch stop layer during a CMP (Chemical Mechanical Polishing) process for a planarization of a subsequently formed surface.

Figure 3B:
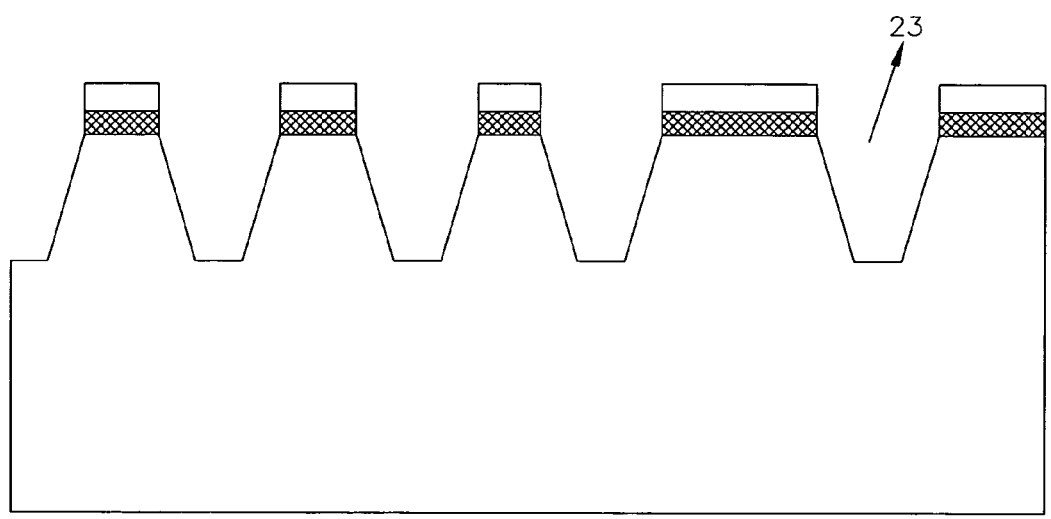

Referring to FIG. 3b, one or more trenches 23 are formed. Using a reticle, a photoresist on the top surface of the nitride layer 22 is exposed and developed to leave a photoresist pattern. After this, the photoresist pattern is used as a mask to form a moat pattern for distinguishing between the active region where a semiconductor device will be formed and the field region where a semiconductor device isolation region will be formed. After the moat pattern is formed by etching both the nitride layer 21 and the oxide layer 22, the exposed substrate is etched by using the moat pattern as a mask, the photoresist is removed and the trench 23 is formed in the semiconductor substrate. Preferably, the trench 23 has a sloped sidewall, with a slope (or angle relative to the plane of the unetched upper surface of substrate 20) of from 60 to 85°.

Figure 3C:
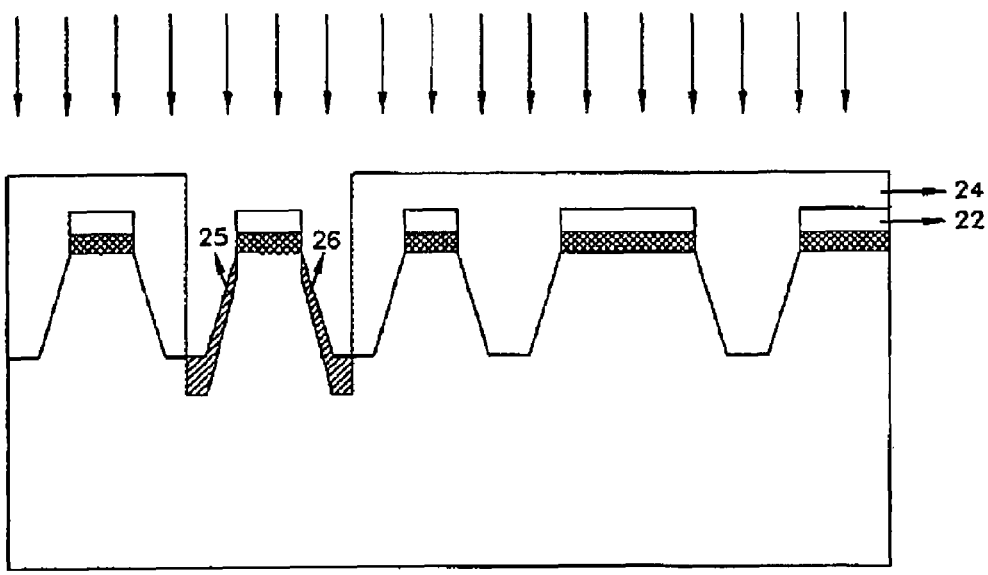

Referring to FIG. 3c, after the formation of a photoresist pattern 24, an ion implantation process is performed. A photoresist 24 is provided on the substrate where the trench is formed. After the photoresist is irradiated and developed to leave a pattern using a reticle, the region where the emitter and the collector of the bipolar transistor will be formed is exposed. Continuingly, the emitter 25 and the collector 26 are formed in the sidewalls and the bottom of the trench by ion implantation into the opening using the photoresist as a mask. B or Ga is implanted for a bipolar PNP transistor, and P or As for a bipolar NPN transistor. The photoresist is then removed. If the step of forming a liner oxide layer is added prior to the ion implantation step, it may reduce damage to the substrate during the ion implantation process.

Figure 3D:
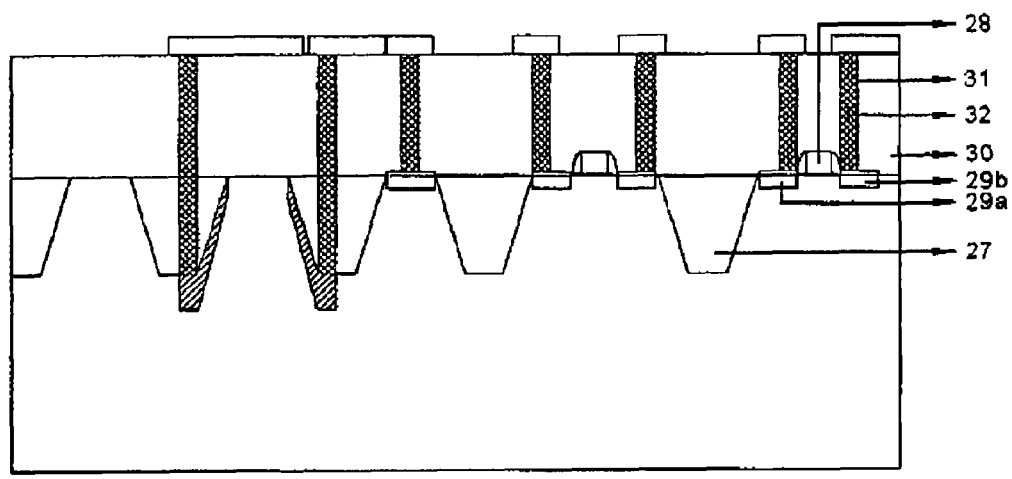

Referring to FIG. 3d device fabrication is completed. In detail, a device isolation structure 27 is formed by depositing an oxide layer into the trenches in the substrate, including the emitter and collector region(s). Thereafter, conventional processes follow. A gate electrode 28 and source and drain regions 29a-b are formed. After an interlayer dielectric layer 30 is deposited on the substrate, contact holes 31 are formed in the interlayer dielectric layer. Metals are filled into the contact holes 31 and contact plugs 32 are formed by performing a planarization process.

Accordingly, the disclosed method can minimize a device area by forming the diffusion layer of an emitter and a collector in the sidewalls and the bottom of the trench after the etching for device isolation structure is completed, and can provide a deep impurity diffusion layer by using the device isolation structure without a high temperature diffusion process. In addition, the described method can provide the manufacturing method of the bipolar transistor which has both a high amplification factor and a high current driving force.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a bipolar transistor comprising the steps of:
    forming first and second device isolation trenches in a substrate;
    forming a photoresist pattern exposing a first sidewall and a first bottom portion of the first trench and a second sidewall and a second bottom portion of the second trench and masking the remaining portions of the first and second trenches, wherein the photoresist pattern exposes substantially all of the first and second sidewalls, and exposes about half of the first bottom portion of the first trench and about half of the second bottom portion of the second trench;
    forming an emitter on both the first sidewall and the first bottom portion of the first trench, and a separate collector on both the second sidewall and the second bottom portion of the second trench by implanting ions using the photoresist pattern as a mask, wherein a surface of the substrate at the first sidewall and the first bottom portion of the first trench, and the second sidewall and the second bottom portion of the second trench are exposed while the ions are implanted;
    removing the photoresist pattern; and
    filling the first and second trenches with an insulation layer to form a device isolation structure that covers the previously formed emitter and collector.

2. A method as defined by claim 1, further comprising the step of forming a liner oxide layer in the first and second trenches prior to implanting the ions.

3. A method as defined by claim 1, wherein the bipolar transistor comprises a PNP transistor, and the ions comprise B and/or Ga.

4. A method as defined by claim 1, wherein the bipolar transistor comprises a NPN transistor, and the ions comprise P and/or As.

5. A method as defined by claim 1, further comprising forming a buffer layer and a nitride layer successively on an upper part of the substrate prior to forming the first and second device isolation trenches.

6. A method as defined by claim 5, wherein the buffer layer comprises a silicon oxide layer.

7. A method as defined by claim 6, wherein the silicon oxide layer has a thickness of from 50 Å to 150 Å.

8. A method as defined by claim 5, wherein the nitride layer comprises a silicon nitride layer having a thickness of from 1000 Å to 1500 Å.

9. A method as defined by claim 5, wherein the nitride layer works as a polish or etch stop layer during a chemical mechanical polishing (CMP) process.

10. A method as defined by claim 1, further comprising forming a base in the substrate.

11. A method as defined by claim 1, wherein the device isolation trench has a sloped sidewall with a slope of from 60° to 85°.

12. A method as defined by claim 1, further comprising forming a gate electrode, source regions, and drain regions on the substrate.

13. A method as defined by claim 12, further comprising forming a dielectric layer on the substrate after forming the gate electrode, the source regions, and the drain regions.

14. A method as defined by claim 13, further comprising forming contact holes in the dielectric layer connected to the emitter, the collector, the source regions, and the drain regions.

15. A method as defined by claim 14, further comprising filling the contact holes with metals.

16. A method as defined by claim 15, further comprising forming contact plugs by a planarization process.

* * * * *